(12) United States Patent
Stan et al.

(10) Patent No.: US 11,451,261 B2
(45) Date of Patent: Sep. 20, 2022

(54) ASYNCHRONOUS STREAM MOTE

(71) Applicant: University of Virginia Patent Foundation, Charlottesville, VA (US)

(72) Inventors: Mircea R. Stan, Charlottesville, VA (US); Luisa P. Gonzalez Guerrero, Knoxville, TN (US)

(73) Assignee: University of Virginia Patent Foundation, Charlottesville, VA (US)

( * ) Notice: Subject to any disclaimer, the term of this patent is extended or adjusted under 35 U.S.C. 154(b) by 124 days.

(21) Appl. No.: 16/947,249

(22) Filed: Jul. 24, 2020

(65) Prior Publication Data
US 2021/0028818 A1 Jan. 28, 2021

Related U.S. Application Data (60) Provisional application No. 62/878,513, filed on Jul. 25, 2019.

(51) Int. Cl.
| | | |
|---|---|---|
| H04B 1/7163 | (2011.01) | |
| H03M 3/00 | (2006.01) | |
| H04B 14/06 | (2006.01) | |
| H04W 84/18 | (2009.01) | |

(52) U.S. Cl.
CPC ........ H04B 1/71635 (2013.01); H03M 3/464 (2013.01); H04B 14/06 (2013.01); H04W 84/18 (2013.01)

(58) Field of Classification Search
CPC ......................... H04B 17/364; H04B 1/71632; H04B 1/7174; H04B 1/7163; H04B 1/71635; H04B 14/06; H03M 1/125; H03M 3/464; H04W 84/18
See application file for complete search history.

(56) References Cited

U.S. PATENT DOCUMENTS

| | | | | |
|---|---|---|---|---|
| 10,022,962 | B1 * | 7/2018 | Linn | B41J 2/0452 |
| 2009/0091485 | A1 * | 4/2009 | Daniels | H03M 1/1265 341/143 |
| 2015/0375041 | A1 * | 12/2015 | Richley | H04B 1/7097 340/870.07 |
| 2016/0142097 | A1 * | 5/2016 | Matic | H04B 1/71632 375/130 |

FOREIGN PATENT DOCUMENTS

WO   WO-2014195739 A1 * 12/2014   ........... H04B 1/7174

OTHER PUBLICATIONS

Alaghi, et al., "Survey of Stochastic Computing," ACM Transactions on Embedded Computing Systems, vol. 12, No. 2s, Article 92, Publication date: May 2013, 19 pages.

(Continued)

*Primary Examiner* — Sophia Vlahos
(74) *Attorney, Agent, or Firm* — Weaver Austin Villeneuve & Sampson LLP (57) ABSTRACT

Asynchronous stream generation and processing techniques are described that support implementation of an asynchronous stream mote in which one or more analog sensor signals are used to generate one or more asynchronous streams. On-device operations processing of the one or more asynchronous streams may be performed before transmission of the result(s) to other system components (e.g., peer motes or higher-level system components).

16 Claims, 6 Drawing Sheets

(56) References Cited

OTHER PUBLICATIONS

Atsumi, et al., "DRAM Using Crystalline Oxide Semiconductor for Access Transistors and not Requiring Refresh for More Than Ten Days." 2012 4th IEEE International Memory Workshop., May 20-23, 2012, 4 pages.

Burleson, et al., "Wave-Pipelining: A Tutorial and Research Survey," IEEE Transactions on Very Large Scale Integration (VLSI) Systems, vol. 6, Issue: 3, Sep. 1998, 11 pages.

Chang, et al, "Architectures for Digital Filters Using Stochastic Computing," 2013 IEEE International Conference on Acoustics, Speech and Signal Processing, May 26-31, 2013, 5 pages.

Gaines, "Stochastic Computing Systems," Advances in Information Systems Science, Ch. 2, pp. 37-172, ISBN 978-1-4899-5843-3, 1969.

Gonzalez-Guerrero, "SC-SD: Towards Low Power Stochastic Computing using Sigma Delta Streams," 2018 IEEE International Conference on Rebooting Computing (ICRC), Nov. 7-9, 2018, 8 pages.

Gonzalez-Guerrero, "ASC-FFT: Area-Efficient Low-Latency FFT Design Based on Asynchronous Stochastic Computing," 2019 IEEE 10th Latin American Symposium on Circuits & Systems (LASCAS), Feb. 24-27, 2019, 4 pages.

Gonzalez-Guerrero, "Error-latency Trade-off for Asynchronous Stochastic Computing with $\Sigma\Delta$ Streams for the IoT," 2019 32nd IEEE International System-on-Chip Conference (SOCC), Sep. 3-6, 2019, 6 pages.

Liu, et al., : Hardware-Efficient Delta Sigma-Based Digital Signal Processing Circuits for the Internet-of-Things, Journal of Low Power Electronics and Applications, Nov. 9, 2015, 23 pages.

Mittal, "A Survey of Techniques for Approximate Computing," ACM Computing Surveys, Mar. 2016 Article No. 62, 33 pages.

Niemelä, et al., "An Ultra Wideband Survey: Global Regulations and Impulse Radio Research Based on Standards," IEEE Communications Surveys & Tutorials, vol. 19, No. 2, Second Quarter 2017, 17 pages.

Poppelbaum, et al., "Stochastic Computing Elements and Systems" AFIPS '67 (Fall): Proceedings of the Nov. 14-16, 1967, 10 pages.

Roy, et al., "Perspective: Stochastic magnetic devices for cognitive computing," Journal of Applied Physics 123, 210901 (2018), 12 pages.

Vahapoglu, et al., "Accurate Synthesis of Arithmetic Operations with Stochastic Logic," 2016 IEEE Computer Society Annual Symposium on VLSI (ISVLSI), Jul. 11-13, 2016, 6 pages.

van Berkel, "Scanning the Technology: Applications of Asynchronous Circuits," Proceedings of the IEEE, vol. 87, No. 2, Feb. 1999, 11 pages.

Warneke, et al.,"Smart Dust: Communicating with a Cubic-Millimeter Computer," Computer (vol. 34, Issue: 1, Jan. 2001), Print ISSN: 0018-9162, 8 pages.

\* cited by examiner

ASYNCHRONOUS STREAM MOTE

STATEMENT OF GOVERNMENT INTEREST

This invention was made with government support under Grant Nos. CCF-1629450 and SHF-1619127 awarded by The National Science Foundation. The government has certain rights in the invention.

INCORPORATION BY REFERENCE

An Application Data Sheet is filed concurrently with this specification as part of this application. Each application to which this application claims benefit or priority as identified in the concurrently filed Application Data Sheet is incorporated by reference herein in its entirety and for all purposes.

BACKGROUND

The Internet of Things (IoT) is predicted to grow exponentially, reaching over a trillion devices in the next two decades. For this to become a reality there will need to be significant advances in power efficiency, packaging, wireless communication, networking, security, and energy harvesting, among other things.

So-called "Smart Dust" is an early example of what would later become known as IoT. The main idea of Smart Dust is to have miniaturized devices (e.g., Smart Dust "motes" measuring 1 $mm^3$ or less) that can locally sense the environment, perform on-chip processing, and then communicate the result among themselves, or to a base station, in order to derive accurate ensemble information based on local measurements.

Stochastic computing has been investigated as one method for achieving low-power processing and compact designs, but has not achieved commercial success because of various limitations. Stochastic computing that employs unipolar stochastic representation operates on streams of 0's and 1's with the magnitude of the signal in the range (0,1) being represented by the ratio of 1's to the total number of bits in the stream. Unipolar representation works well for unsigned numbers. Bipolar stochastic representation uses 1's for +1 and 0's for −1, with the magnitude of a number in the range (−1,1) being represented by the ratio of the difference between the total number of +1's and −1's to the total number of bits.

By operating on streams, stochastic computing can use simple logic gates to implement more complex arithmetic computation. For example, to implement multiplication, an AND gate may be used for unipolar representation, and an XNOR gate for bipolar representation. This can lead to savings in area and power at the expense of performance (because of the need for serial processing) and accuracy (because of stochasticity).

Stochastic computing is an example of the more general class of approximate computing paradigms. One weakness of some approximate computing techniques is that they do not distinguish between the source of "approximation," which could be either reduced accuracy or reduced precision. With regard to signal precision, it is well understood that accuracy and precision need to be matched for an optimal design. For example, an analog-to-digital converter's effective number of bits (ENOB) is upper-bounded by its signal to noise ratio (SNR). Any attempted resolution higher than the ENOB is a waste of area and power in that the lower-level bits become virtually random, and therefore offer no actual extra precision. As a result, some high-precision, but inaccurate, approximate computing solutions (e.g., pruned adders or multipliers) provide fewer benefits than a simple reduction in precision (i.e., fewer bits).

For stochastic computing, precision relates to the number of bits in the stream (i.e., the longer the stream, the higher the precision), while accuracy relates to both the length of stream(s) and the stochastic independence of the streams that are combined in an arithmetic operation. If the streams are not fully independent, making them longer will increase precision but the result will remain inaccurate.

To avoid these accuracy and precision challenges, conventional stochastic computing requires long and independent stochastic streams. Unfortunately, it is expensive both to generate such streams and to maintain their independence during the computation. Because of this there have been recent attempts to keep the attractive aspects of stochastic computing (e.g., serial operation on streams using simple logic gates for arithmetic) while avoiding, or reducing, the need for stochasticity and independence. These so-called deterministic stream computing methods can lead to accurate results but only through the addition of a significant overhead in complexity. It should also be noted that such methods are only accurate up to the level of precision determined by the length of the stream, with longer streams leading to more accurate and precise results at the expense of lower performance.

Previous stream processing solutions are characterized by a variety of limitations. A significant limitation relates to the fact that such solutions require synchronous stream generation and exact synchronization of streams at the inputs of the logic gates that operate on them. Achieving reasonable performance means that there is a need for a fast clock with minimal jitter and skew. This results in significant power overhead as well as significant timing constraints on clock distribution. Similar timing constraints apply to the stream signals in such stream processing solutions in that the data signals need to arrive at the inputs of a logic gate simultaneously; a much tighter constraint than conventional digital circuits. As a result, variations of any kind (e.g., process, temperature, design) lead to skew and jitter on stochastic streams that make it very difficult, if not impossible, to reliably meet these constraints.

Conventional stochastic computing solutions also require long streams for reasonable precision and accuracy which reduces performance. The stochasticity requirement means that expensive random number generators are needed; either in the form of pseudo-random number generators or mechanisms that attempt to exploit the randomness of various physical phenomena (e.g., thermal noise on a diode junction, or magnetization reversal in an unstable magnetic layer). Some deterministic stream solutions pose slightly lower demands on stream length but still require fast clocks as well as circuits with a complexity similar to a pseudo-random number generator for stream generation.

In addition, for a full IoT solution, there will be additional overhead related to converting information between the stream processing and digital domains, e.g., to store data in memory or to transmit data wirelessly. Wireless communication is itself a significant bottleneck for IoT motes as it consumes a significant percent of the available power budget.

SUMMARY

According to a particular class of implementations, a device includes one or more asynchronous stream generators, each of which is configured to receive an analog signal and to generate an asynchronous stream representing the analog signal. The asynchronous stream for each asynchronous stream generator represents a magnitude of the corresponding analog signal as a stream of values in which a duty factor of the stream of values is based on the magnitude of the corresponding analog signal. One or more asynchronous stream processors is/are configured to receive at least one of the asynchronous streams generated by the one or more asynchronous stream generators and to generate a corresponding result. A transmitter is configured to wirelessly transmit a signal representing the result.

According to a specific implementation of this class, the one or more asynchronous stream generators include a continuous-time sigma-delta modulator.

According to another specific implementation of this class, the device includes circuitry configured to modulate the transmitter using information in the result as a modulation scheme. According to a more specific implementation, the transmitter is an impulse radio ultra-wide band transmitter.

According to another specific implementation of this class, the device includes one or more sensors, each sensor being configured to generate a corresponding one of the analog signals.

According to another specific implementation of this class, the device includes a memory connected to the one or more stream processors. The memory has stream processing information stored therein for use by the one or more stream processors in generating the result. According to a more specific implementation, the memory is an analog memory, and the device includes at least one additional asynchronous stream generator configured to provide the stream processing information from the analog memory to the one or more stream processors as one or more additional asynchronous streams. According to an even more specific implementation, the device includes a digital-to-analog converter configured to convert at least one of the one or more asynchronous streams to analog information for storage in the analog memory.

According to another class of implementations, a device includes an asynchronous stream generator configured to receive an analog signal and to generate an asynchronous stream representing the analog signal. The asynchronous stream represents a magnitude of the analog signal as a stream of values in which a duty factor of the stream of values is based on the magnitude of the analog signal. The device includes an impulse radio ultra-wide band transmitter configured to wirelessly transmit a signal. The device also includes circuitry configured to modulate the transmitter using a modulation scheme based on the asynchronous stream.

According to a specific implementation of this class, the device includes a sensor configured to generate the analog signal.

According to another specific implementation of this class, the asynchronous stream generator includes a continuous-time sigma-delta modulator.

According to another specific implementation of this class, the device includes a stream processor configured to receive the asynchronous stream generated by the asynchronous stream generator and to generate a corresponding result. The modulation scheme is based on the result. According to a more specific implementation, the device includes a memory connected to the stream processor. The memory has stream processing information stored therein for use by the stream processor in generating the result. According to an even more specific implementation, the memory is an analog memory, and the device includes at least one additional asynchronous stream generator configured to provide the stream processing information from the analog memory to the stream processor as one or more additional asynchronous streams. According to an even more specific implementation, the device includes a digital-to-analog converter configured to convert the asynchronous stream to analog information for storage in the analog memory.

According to another class of implementations, a device includes one or more sensors, each of which is configured to generate a corresponding analog signal. One or more asynchronous stream generators is/are configured to receive a corresponding one of the analog signals and to generate an asynchronous stream representing the corresponding analog signal. The asynchronous stream for each asynchronous stream generator represents a magnitude of the corresponding analog signal as a stream of values in which a duty factor of the stream of values is based on the magnitude of the corresponding analog signal. The device includes one or more asynchronous stream processors, each of which is configured to receive at least one of the asynchronous streams generated by the one or more asynchronous stream generators and to generate a corresponding result. The device includes analog memory having stream processing information stored therein for use by the one or more stream processors in generating one or more of the results. The device includes at least one additional asynchronous stream generator configured to provide the stream processing information from the analog memory to the one or more stream processors as one or more additional asynchronous streams. The device includes an impulse radio ultra-wide band transmitter configured to wirelessly transmit a signal. The device includes circuitry configured to modulate the impulse radio ultra-wide band transmitter using a modulation scheme based on the asynchronous stream.

According to a specific implementation of this class, the one or more asynchronous stream generators include a continuous-time sigma-delta modulator.

According to another specific implementation of this class, the device includes a digital-to-analog converter configured to convert at least one of the one or more asynchronous streams to analog information for storage in the analog memory.

A further understanding of the nature and advantages of various implementations may be realized by reference to the remaining portions of the specification and the drawings.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Asynchronous stream generation and processing techniques are enabled by the present disclosure that support implementation of a wide variety of devices. According to a particular class of implementations, a device referred to herein as an asynchronous stream mote or ASM is enabled in which one or more analog signals (e.g., the output of one or more sensors) are used to generate one or more asynchronous streams. On-device (e.g., on-chip or on-board) operations (e.g., processing and/or computing) using the one or more asynchronous streams may be performed before transmission of the result(s) to other system components (e.g., peer motes or higher-level system components, such as base stations). In some cases, the one or more asynchronous streams themselves may be used more directly (e.g., as the basis for a modulation scheme) to transmit the information represented. As will be discussed, implementations enabled by the present disclosure variously address some or all of the limitations of previous techniques discussed above. Some examples will be instructive.

Figure 1:
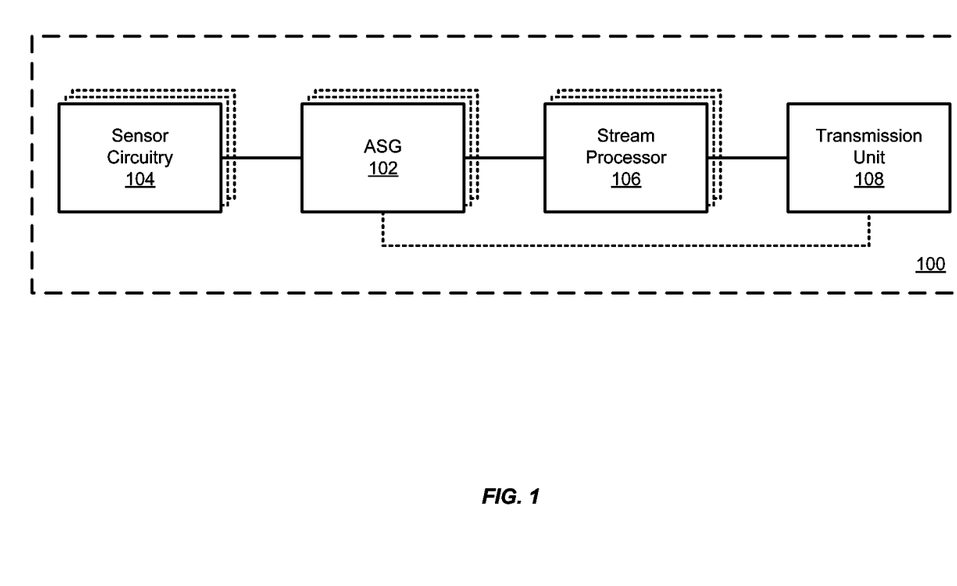
FIG. 1 is a simplified block diagram of an asynchronous stream mote (ASM) enabled by the present disclosure.

FIG. 1 is a simplified block diagram of an asynchronous stream mote (ASM) 100 enabled by the present disclosure. In the depicted example, one or more asynchronous stream generation units (ASGs) 102 each receive an analog signal. In the depicted example the analog signal(s) originate(s) from sensor circuitry 104. As will become apparent, the techniques enabled by the present disclosure may be applied to a wide variety of analog signals and are not limited to sensing applications. In addition, sensor circuitry 104 may vary considerably depending on the implementation.

For example, sensor circuitry 104 may include one or more sensors configured to measure or detect conditions in an environment in which ASM 100 is deployed. Such sensors might include, for example, temperature sensors, humidity sensors, pressure sensors, force sensors, accelerometers, cameras, chemical sensors, biometric sensors, electromagnetic energy sensors, light sensors, photodetectors, radio-frequency detectors, etc. Alternatively, sensor circuitry 104 might include one or more sensor interfaces configured to receive sensor outputs via wired or wireless transmissions from one or more sensors external to ASM 100.

Sensor circuitry 104 may also include signal conditioning circuitry (not shown) configured to modify or convert sensor output signals to meet the input requirements of the one or more ASGs 102. Depending on the implementation(s) of ASG(s) 102, this might include, for example, circuitry for amplification, filtering, level conversion, voltage-to-current conversion, current-to-voltage conversion, resistance-to-voltage (or current) conversion, digital-to-analog conversion, and the like.

Each ASG 102 is configured to generate an asynchronous stream that represents the magnitude of the corresponding analog signal as a stream of values in which the duty factor of the stream of values is based on the magnitude of the corresponding analog signal. Any of the classes of circuits characterized as voltage-to-time converters or current-to-time converters may be used to implement ASG 102. Examples include delay lines, pulse-width modulators, sigma-delta modulators, etc. It should be noted that the term "asynchronous" as applied to stream generation herein reflects the fact that no clock is used, and refers only to a subset of asynchronous solutions as conventionally understood. In particular, as used herein in connection to stream generation, "asynchronous" focuses primarily on delay-dependent solutions in a manner analogous to the way that a ring oscillator or a wave pipelined circuit is asynchronous and delay dependent.

As mentioned above, various implementations may include one or multiple ASGs. For example, a temperature sensing mote might only need one stream generated from the analog signal output of its associated temperature sensor. Alternatively, a mote could receive inputs from multiple sources from which its multiple ASGs generate multiple streams that may be combined in some way, e.g., a sensor mote might include multiple sensors for temperature, pressure, humidity, etc., that are combined to generate a single signal representing a fault with any one or more of those parameters.

Figure 2:
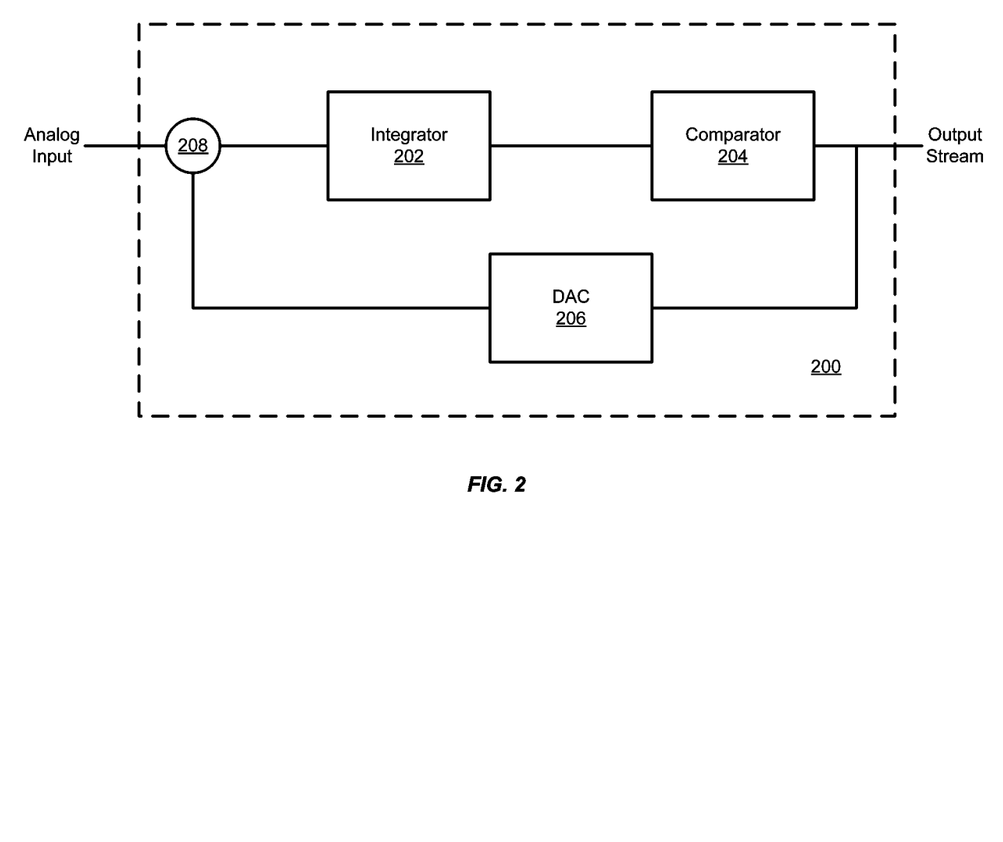
FIG. 2 is a simplified block diagram of a Sigma-Delta modulator that may be used with various implementations enabled by the present disclosure.

According to a particular sub-class of implementations, ASG 102 is implemented using a continuous-time Sigma-Delta modulator. The Sigma-Delta modulator may be a first-order modulator or a higher-order modulator, depending on the implementation. As illustrated in FIG. 2, a first-order continuous-time Sigma-Delta modulator 200 includes an integrator 202, a comparator 204 (e.g., a 1-bit analog-to-digital converter (ADC)), a 1-bit digital-to-analog converter (DAC) 206 in a feedback loop, and a summing node 208 (e.g., an adder) that subtracts the output of the DAC from the analog input. Unlike a conventional Sigma-Delta analog-to-digital converter (ADC), the depicted scheme does not use a decimator because it works with streams and therefore has no need to generate multi-bit digital representations. As will be appreciated, eliminating the need for a decimator saves area and power.]

A continuous-time Sigma-Delta modulator is distinguished from a synchronous Sigma-Delta modulator by the absence of a clock for the comparator. For a synchronous Sigma-Delta modulator, the output stream is synchronous with the comparator's clock. By contrast, the timing of the asynchronous output of a continuous-time Sigma-Delta modulator is determined by either a delay on the feedback or by using a Schmitt-trigger comparator with two thresholds.

According to a particular implementation, each ASG 102 is implemented using a current-mode, first-order modulator. This allows for subtraction of the feedback current from the input current according to Kirchhoff's current law simply by connecting the two corresponding conductors together. In addition, with a current-mode design, the ASG's integrator may be implemented as a simple capacitor, the 1-bit ADC comparator may be implemented as a simple inverter, and the 1-bit DAC may be implemented with a simple current source using a current mirror. As will be appreciated by those of skill in the art, such an implementation compares favorably in terms of both power and area with a conventional stream generating circuit for stochastic computing, even before considering the overhead of fast clock distribution. For an analog input in the range (0,1) (or (−1,1) for signed values), the output of a continuous-time Sigma-Delta modulator is a periodic signal with a frequency $f_i$ that depends on the input, the time constant of the integrator, and the delay in the feedback loop or the value of the thresholds for the Schmitt-trigger (depending on the implementation).

For implementations in which multiple asynchronous streams are generated, as long as the correlation between the streams is low, the same type of logic gates used for conventional synchronous stochastic computing (e.g., AND or XNOR gates for multiplication, multiplexers for addition) may be used for processing asynchronous streams in implementations enabled by the present disclosure. In addition, implementations are contemplated in which an exact adder may be employed.

Figure 3:
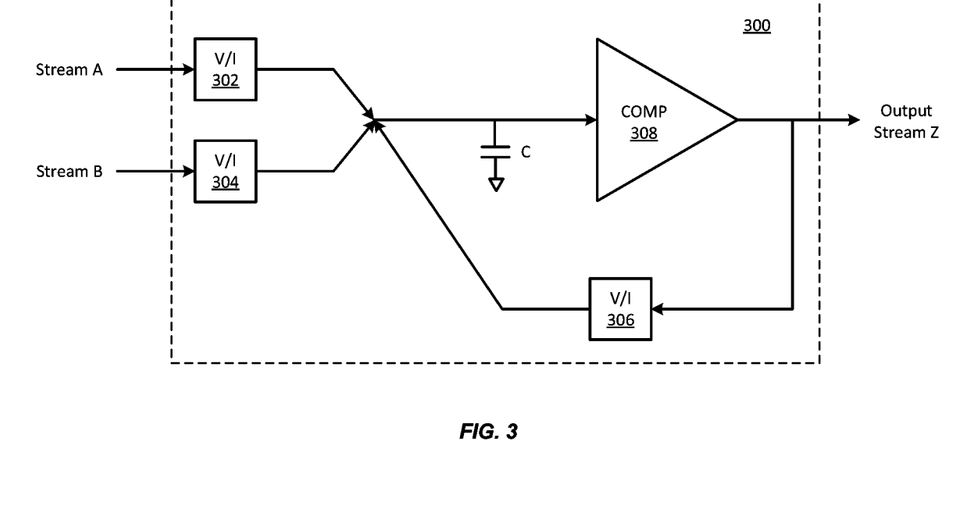
FIG. 3 is a simplified diagram of an adder that may be used with various implementations enabled by the present disclosure.

According to one such implementation depicted in FIG. 3, instead of using a stochastic (approximate) adder as digital gates operating on streams at the outputs of the Sigma-Delta modulators, an exact adder is obtained by converting the streams being added to currents (using converters 302, 304, and 306; potentially using substantially the same circuitry as the current mirror used for the feedback) and then adding them together using Kirchhoff's current law; with the current from the DAC in the feedback path still being subtracted from the total current, the output stream representing the exact value of the inputs added together.

Adder 300 of FIG. 3 includes a capacitor C embedded in a feedback loop that acts as an asynchronous memory element, similar to the capacitor in the ASG. The capacitor C keeps track of the equivalent carry when both input streams are 1, eliminating the error associated with computing with streams. The current sources in the adder are positive or negative in accordance with the adder inputs A and B and the output Z. For example, when A=1, A=1, and Z=0, Z needs to switch to 1 and there is the equivalent of a carry. The capacitor, acting as an integrator, accumulates charge equivalent to the time Z should be 1, including the "carry-time." This condition remains true until the voltage on the capacitor (which is also the input for comparator 308) reaches the switching-threshold of comparator 308, and Z transitions from 0 to 1. Z will remain at 1 for a time equivalent to the charge accumulated in the capacitor. Notice, that when A, B, or Z transitions, comparator 308 switches the polarity of the feedback current source to enable the discharge or charge of the capacitor.

If full precision on the inputs is desired, the output needs to be scaled accordingly (similar scaling is also common in digital integer or fixed-point computations). This may be done by controlling the voltage-to-current conversion of converters 302, 304, and 306. For example, if the outputs are scaled to half, the currents are reduced to half as well. With additional components such as, for example, adders and multipliers, Asynchronous Stream Processing (ASP) operations equivalent to Digital Signal Processing (DSP) operations (e.g., filtering, FFTs, etc.) may be achieved. It should be noted that signal processing (e.g., an FFT) may be achieved with approximate adders, but performance may be adversely affected.

Besides accuracy, another advantage of using exact adders is that the streams may not need to be independent. However, there are instances when independence is required. In such instances, the correlation between the streams may be reduced by, for example, making each Sigma-Delta modulator different from the others using design variations, e.g., varying the delays on the feedback loops, varying the thresholds of the Schmitt-triggers, or varying the current magnitudes of the voltage-to-current converters used for the input and the feedback DAC. Another approach is to rely on sources of stochasticity such as, for example, thermal noise, either in the form of noise on a device (e.g., a diode), or in a magnetic material. There is also an option of using an asynchronous LFSR, either in a delay-insensitive design, or a delay-based design that uses delay elements to mimic the registers in a conventional synchronous LFSR. Such LFSRs may also prove useful for adding security features to an ASM enabled by the present disclosure.

Referring again to FIG. 1, ASM 100 may include one or more stream processors 106 that is (are) capable of performing a wide variety of on-device operations using the one or more asynchronous streams generated by ASG(s) 102. Such operations may include any of a wide variety of ASP functions such as, for example, filtering, Fast Fourier Transforms (FFT), finite impulse response (FIR) filtering, infinite impulse response (IIR) filtering, frequency analysis, etc. Other types of operations on and/or combinations of one or more streams include Asynchronous Stochastic Computing (ASC) logical and arithmetic operations, identification or classification, anomaly detection (e.g., using artificial neural networks (ANNs)), and any of a wide variety of computational operations.

The result(s) generated by stream processor(s) 106 are transmitted (e.g., to neighboring motes or other system components) via transmission unit 108. As will be appreciated, the nature of the result generated by a stream processor 106 will vary considerable depending on the nature of the operations performed on the asynchronous stream(s) and the domain in which the result is provided (e.g., asynchronous stream domain vs. digital domain). In some implementations, the asynchronous stream(s) generated by ASG(s) 102 may be provided to transmission unit 108 without any intervening on-device processing. This is represented in FIG. 1 by the dashed line bypassing stream processor(s) 106. Such a configuration might be useful in cases where, for example, transmission of raw sensor data as an asynchronous stream is desired.

Transmission unit 108 might include, for example, a radio frequency (RF) transmitter, a modulator for controlling operation of the transmitter according to a modulation scheme, and potentially some kind of translation and/or conditioning circuitry that converts the output of stream processor(s) 106 to the signal type and/or levels required by the modulator and/or the transmitter. In some implementations, such translation/conditioning circuitry might include circuitry that translates the output of stream processor(s) 106 from the asynchronous stream processing domain to the digital domain.

However, depending on the implementation, some portion of the processing or computing performed by stream processor(s) 106 may or may not be in the asynchronous stream processing domain. For example, even if the streams are generated asynchronously as described herein, some portion or even the majority of the processing of the information represented in the stream or streams may be performed in the synchronous or digital domain. However, a class of implementations is contemplated in which stream processing is performed in the asynchronous domain (e.g., ASP and/or ASC).

According to such implementations, the circuitry employed for stream processing (e.g., logic, filters, state machine functionality, etc.) may be implemented using delay-insensitive asynchronous circuits. Implementations are also contemplated in which some form of stream-like delay-based logic may be used to complement the arithmetic capabilities of ASM 100. According to various implementations, on-device operations are supported using digital or analog memory. Additional information relating to the processing of asynchronous streams that may be performed by implementations enabled by the present disclosure is provided in *SC-SD: Towards Low Power Stochastic Computing* using *Sigma Delta Streams*, Gonzalez-Guerrero et al., IEEE International Conference on Rebooting Computing (ICRC) © 2018, the entirety of which is incorporated herein by reference for all purposes.

At least some of the implementations enabled by the present disclosure are characterized by the advantage that they avoid signal conversions between the asynchronous stream and digital domains. According to a particular class of implementations, the use of analog memory supports the on-device processing of asynchronous streams while also avoiding such conversions. According to some of these implementations, this may be achieved using a DAC or a low-pass filter on the asynchronous stream and storing the resulting information in analog form.

Any of a variety of existing or emerging memory technologies may be employed for this purpose. For example, the information may be stored in one or more capacitors. Alternatively, memristors, flash memory, resistive RAM, and any other type of memory capable of storing analog values may be employed. According to a specific implementation, an emerging memory technology may be used that is based on an oxide-semiconductor-based thin-film transistor (TFT) using indium-gallium-zinc-oxide (IGZO) and known as nonvolatile oxide-semiconductor random access memory (NOSRAM). IGZO-based memory can give rise to quasi-nonvolatile memories even when using straightforward circuit topologies such as persistent DRAM. It should be noted that these are merely examples of some of the types of analog memory that might be employed.

Figure 4:
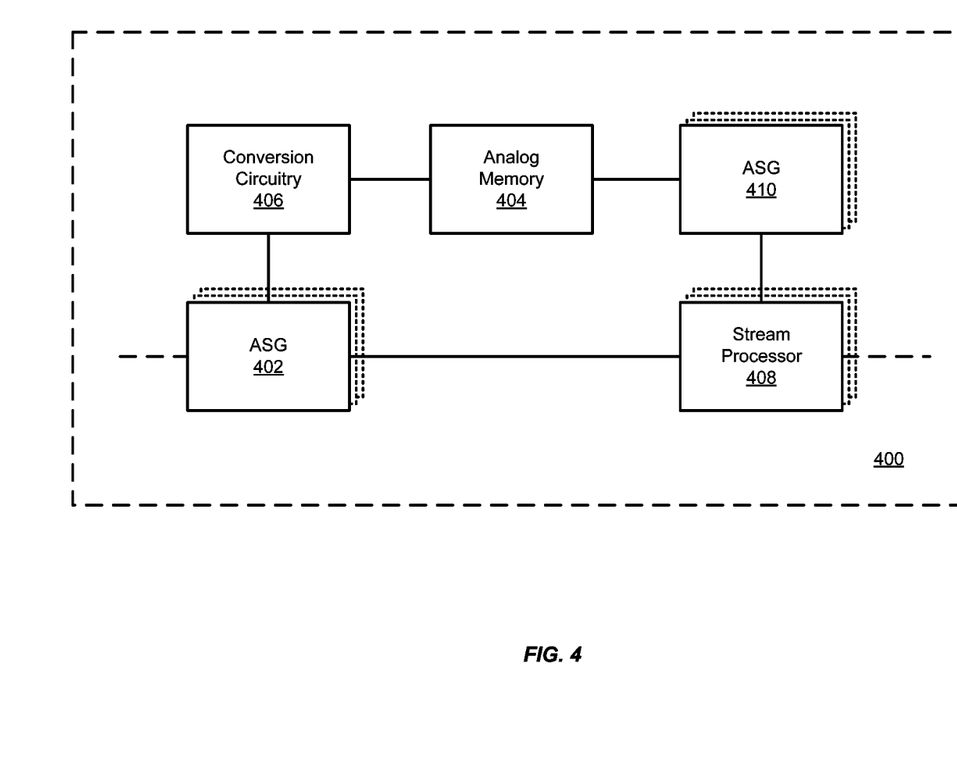
FIG. 4 is a simplified block diagram of another asynchronous stream mote (ASM) enabled by the present disclosure.

According to some implementations, information stored in analog memory is converted to an asynchronous stream for processing. This may be accomplished, for example, in a manner similar to that described above with reference to ASG 102 of FIG. 1. FIG. 4 includes a block diagram of an asynchronous stream mote (ASM) 400 that includes such a configuration.

ASM 400 includes one or more ASGs 402 each of which generates an asynchronous stream based on a corresponding analog input signal as described above. ASM 400 also includes analog memory 404. For implementations in which information in or based on the asynchronous stream(s) needs to be stored in memory 404, conversion circuitry 406 (e.g., one or more DACs) may optionally be used to convert the asynchronous stream to analog information that may be stored in memory 404.

The information stored in memory 404 may also be provided to one or more stream processors 408 via another set of one or more ASGs 410. Stream processor(s) 408 may also receive and process the one or more asynchronous streams from ASG(s) 402 in conjunction with the information received from ASG(s) 410. As discussed above with reference to stream processor(s) 106, stream processor(s) 408 may perform operations that include any of a wide variety of ASP and/or ASC operations.

Also as discussed above, ASGs 402 and 410 may be implemented as continuous-time Sigma-Delta modulators or suitable alternatives. As will be appreciated, the use of ASG(s) 410 in conjunction with analog memory 404 supports on-device processing (e.g., ASP and/or ASC) while obviating the need for converting between the asynchronous stream and digital domains. However, it should be noted that implementations in which such all or some portion of such processing takes place in the digital domain are contemplated.

The inclusion of on-device memory (preferably but not necessarily non-volatile memory), whether analog or more conventional digital memory, supports on-device processing of asynchronous streams that require the ability to store state, intermediate results, filter coefficients, etc. However, it should be noted that implementations are contemplated in which on-device stream processing may be supported without the need for such on-device memory.

According to one class of implementations, asynchronous stream processing principles are applied in the context of wireless communication to enable further optimizations that may be used in the context of an asynchronous stream mote as enabled by the present disclosure. According to some of these implementations, an asynchronous stream may be used as the basis for modulation of a transmitter. That is, the changing state of the asynchronous stream is used as the basis for the modulation scheme rather than a more traditional separate modulation scheme, thereby obviating the need for implementing such a separate scheme along with its associated overhead.

Figure 5:
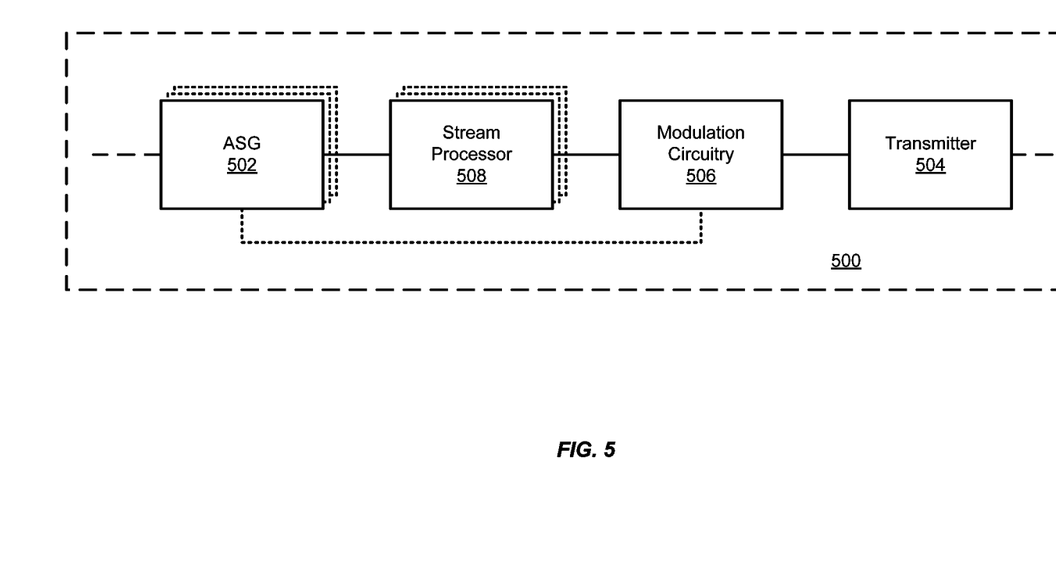
FIG. 5 is a simplified block diagram of another asynchronous stream mote (ASM) enabled by the present disclosure.

According to a specific class of implementations, an example of which is illustrated in FIG. 5, an asynchronous stream mote (ASM) 500 includes one or more asynchronous stream generators (ASGs) 502 that operate on one or more analog signals to generate one or more asynchronous streams as described above. ASM 500 also includes a transmitter 504 that wirelessly transmits information from ASM 500 to, for example, peer motes or other system components, such as base stations. According to a specific implementation, transmitter 504 is an Asynchronous Impulse Radio (AIR) impulse-radio ultra-wide band (IRUWB) transmitter.

IRUWB transmitters were proposed more than 20 years ago and there have been recent efforts toward standardization. See, for example, *An ultra wideband survey: Global regulations and impulse radio research based on standards*, Niemelä, V., Haapola, J., Hämäläinen, M., & Iinatti, J., IEEE Communications Surveys & Tutorials, 19(2), 874-890 (2017), the entirety of which is incorporated herein by reference for all purposes. Controlling a radio frequency (RF) transmitter (e.g., transmitter 504) to generate a IRUWB signal from an asynchronous stream (e.g., generated by ASG(s) 502) may be accomplished, for example, by taking a derivative of the asynchronous stream, with the resulting delta functions serving as the modulation signal for the AIR IRUWB transmitter. This is represented in FIG. 5 by modulation circuitry 506.

In some implementations, the asynchronous stream used as the basis for modulating the transmitter may represent or be derived from the result(s) of on-device processing (e.g., using ASP and/or ASC) of asynchronous stream(s) that are themselves generated from analog signal input(s), e.g., from one or more sensors. This is represented in FIG. 5 by stream processor(s) 508. In other implementations, the asynchronous stream used as the basis for modulating the transmitter could be the stream generated from an analog signal input without any intervening on-device processing. This is represented in FIG. 5 by the dashed line bypassing stream processor(s) 508. Such a configuration might be useful in cases where, for example, transmission of raw sensor data as an asynchronous stream is desired. As discussed above with reference to stream processor(s) 106 and 408, stream processor(s) 506 may perform operations that include any of a wide variety of ASP and/or ASC operations.

Figure 6:
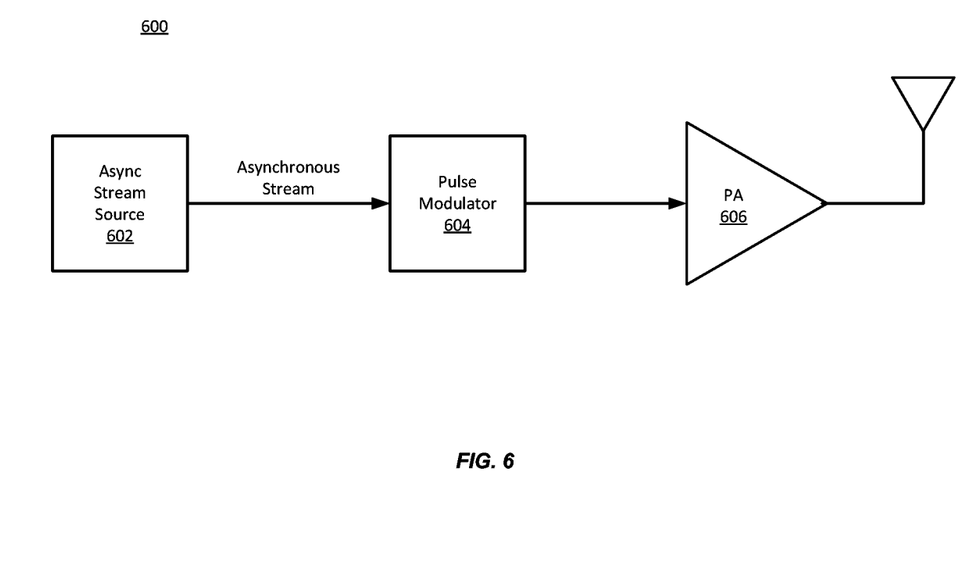
FIG. 6 is a simplified diagram of an impulse-radio ultra-wide band (IRUWB) transmitter that may be used with implementations enabled by the present disclosure.

An example of an AIR IRUWB transmitter 600 is shown in FIG. 6. As illustrated, an asynchronous stream generated by asynchronous stream source 602 (e.g., a Sigma-Delta modulator using OOK or PPM signaling) is directly mapped by pulse modulator 604 to an IRUWB pulse stream in which the edges of the stream pulses are transmitted (after amplification by power amplifier 606) as (modulated) narrow pulses, e.g., by taking the derivative of the asynchronous stream and transmitting the pulse as a Gaussian pulse. More complex schemes can be also implemented, e.g., by sending a higher derivative of the Gaussian (first, second, third, etc. derivative), or using the pulse to gate a carrier frequency, or any other of the methods proposed by the IRUWB research community. It should be noted that asynchronous stream source 602 may be any kind of ASG as described elsewhere herein, or may be an asynchronous stream processor that performs some kind of processing and/or computing (e.g., ASP and/or ASC) on an asynchronous input stream.

It should be appreciated that, in conjunction with the other techniques described herein, the ability to use an asynchronous stream as the basis for modulating a transmitter enables an end-to-end solution for an asynchronous stream mote (ASM) that obviates the need for clocked circuitry. As will be appreciated, the power and area advantages enjoyed by such an end-to-end solution may enable a "Smart Dust" mote that realizes the vision of the Internet of a Trillion Things.

As will be appreciated, any of the features or elements of the implementations described above may be combined with any of the other features or elements of any of the other implementations described. And depending on the combination of features or elements of a given implementation, one or more of the disadvantages of prior techniques may be addressed.

Moreover, implementations enabled by the present disclosure may be employed in any of a wide variety of applications. For example, military applications might include monitoring friendly forces, equipment, and ammunition (e.g., enabling leaders and commanders to constantly monitor the status of friendly troops), battlefield surveillance (e.g., identifying critical terrains and approach routes by rapidly covering geographic areas with sensor networks), targeting (e.g., incorporating sensors and sensor networks into guidance systems of intelligent ammunition), battle damage assessment (e.g., deploying sensor networks in a target area before or after engagement), and nuclear, biological and chemical attack detection and reconnaissance (e.g., deployment of sensors and sensor networks at ground zero is important for timely and accurate detection of the agents).

Examples of environmental applications include forest fire detection (e.g., sensor motes can relay the exact origin of the fire before the fire spread is uncontrollable), biocomplexity mapping of the environment (e.g., integrating information across temporal and spatial scales), flood detection (e.g., using rainfall, water level, and weather sensors and sensor networks), and precision agriculture (e.g., monitoring pesticides level in the drinking water, the level of soil erosion, and the level of air pollution in real time).

Examples of health applications include tele-monitoring of human physiological data (e.g., collecting physiological data, monitoring and detecting elderly people's behavior), tracking and monitoring doctors and patients in a hospital (e.g., sensor motes that may detect heart rate, blood pressure, etc.), and drug administration in hospitals (e.g., reducing the chance of getting and prescribing the wrong medication to patients).

Examples of home applications include home automation (e.g., smart sensor motes and actuators incorporated in appliances allowing management of home devices locally and remotely), human-centered smart environments (e.g., adapting to the needs of the end users in terms of input/output capabilities), and technology-centered smart environments (e.g., sensor motes embedded in furniture and appliances communicate with each other to become self-organizing, self-regulated, and adaptive).

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A device, comprising:
    first asynchronous stream generator circuitry configured to receive an analog signal and to generate an asynchronous stream representing the analog signal, the asynchronous stream representing a magnitude of the analog signal as a stream of values in which a duty factor of the stream of values is based on the magnitude of the analog signal;
    one or more asynchronous stream processors configured to receive a first one or more asynchronous streams generated by the first asynchronous stream generator circuitry and to generate one or more results;
    an analog memory having stream processing information stored therein for use by the one or more asynchronous stream processors in generating the one or more results;
    second asynchronous stream generator circuitry configured to provide the stream processing information from the analog memory to the one or more asynchronous stream processors as a second one or more asynchronous streams; and
    a transmitter configured to wirelessly transmit a signal representing the one or more results.

2. The device of claim 1, wherein the first asynchronous stream generator circuitry includes a continuous-time sigma-delta modulator.

3. The device of claim 1, further comprising circuitry configured to modulate the transmitter using information in the one or more results as a modulation scheme.

4. The device of claim 3, wherein the transmitter is an impulse radio ultra-wide band transmitter.

5. The device of claim 1, further comprising one or more sensors configured to generate the analog signal.

6. The device of claim 1, wherein the analog memory is connected to the one or more asynchronous stream processors.

7. The device of claim 1, further comprising a digital-to-analog converter configured to convert the first one or more asynchronous streams to analog information for storage in the analog memory.

8. A device, comprising:
    first asynchronous stream generator circuitry configured to receive an analog signal and to generate an asynchronous stream representing the analog signal, the asynchronous stream representing a magnitude of the analog signal as a stream of values in which a duty factor of the stream of values is based on the magnitude of the analog signal;
    one or more asynchronous stream processors configured to receive a first one or more asynchronous streams generated by the first asynchronous stream generator circuitry and to generate one or more results;
    an analog memory having stream processing information stored therein for use by the one or more asynchronous stream processors in generating the one or more results;

second asynchronous stream generator circuitry configured to provide the stream processing information from the analog memory to the one or more asynchronous stream processors as a second one or more asynchronous streams;

an impulse radio ultra-wide band transmitter configured to wirelessly transmit a signal representing the one or more results; and circuitry configured to modulate the transmitter using a modulation scheme based on the one or more asynchronous streams.

9. The device of claim 8, wherein the first asynchronous stream generator circuitry includes a continuous-time sigma-delta modulator.

10. The device of claim 8, wherein the modulation scheme is based on the one or more results.

11. The device of claim 8, wherein the analog memory is connected to the one or more asynchronous stream processors.

12. The device of claim 8, further comprising a digital-to-analog converter configured to convert the first one or more asynchronous streams to analog information for storage in the analog memory.

13. The device of claim 8, further comprising a sensor configured to generate the analog signal.

14. A device, comprising:

one or more sensors configured to generate an analog signal;

first asynchronous stream generator circuitry configured to receive the analog signal and to generate an asynchronous stream representing the analog signal, the asynchronous stream representing a magnitude of the analog signal as a stream of values in which a duty factor of the stream of values is based on the magnitude of the analog signal;

one or more asynchronous stream processors configured to receive a first one or more asynchronous streams generated by the first asynchronous stream generator circuitry and to generate one or more results;

an analog memory having stream processing information stored therein for use by the one or more asynchronous stream processors in generating the one or more results;

second asynchronous stream generator circuitry configured to provide the stream processing information from the analog memory to the one or more asynchronous stream processors as a second one or more asynchronous streams;

an impulse radio ultra-wide band transmitter configured to wirelessly transmit a signal; and circuitry configured to modulate the impulse radio ultra-wide band transmitter using a modulation scheme.

15. The device of claim 14, wherein the first asynchronous stream generator circuitry includes a continuous-time sigma-delta modulator.

16. The device of claim 14, further comprising a digital-to-analog converter configured to convert the first one or more asynchronous streams to analog information for storage in the analog memory.

* * * * *